United States Patent
Kurachi et al.

(10) Patent No.: US 8,293,129 B2
(45) Date of Patent: Oct. 23, 2012

(54) METHOD FOR MANUFACTURING PIEZOELECTRIC ELEMENT

(75) Inventors: Katsuyuki Kurachi, Tokyo (JP); Hirofumi Sasaki, Tokyo (JP)

(73) Assignees: TDK Corporation, Tokyo (JP); SAE Magnetics (H.K.) Ltd., Hong Kong (CN)

( * ) Notice: Subject to any disclaimer, the term of this patent is extended or adjusted under 35 U.S.C. 154(b) by 396 days.

(21) Appl. No.: 12/617,337

(22) Filed: Nov. 12, 2009

(65) Prior Publication Data

US 2010/0147789 A1      Jun. 17, 2010

(30) Foreign Application Priority Data

Dec. 16, 2008  (JP) ................................. 2008-319906

(51) Int. Cl.
   *C03C 15/00*    (2006.01)

(52) U.S. Cl. ................ 216/100; 216/37; 216/67; 438/3; 438/745; 438/750

(58) Field of Classification Search .............. 216/37, 216/67, 100; 438/3, 704, 745, 750
See application file for complete search history.

(56) References Cited

U.S. PATENT DOCUMENTS

| | | | |
|---|---|---|---|
| 4,759,823 A | | 7/1988 | Asselanis et al. |
| 6,692,976 B1 * | | 2/2004 | Mirkarimi et al. ................ 438/3 |
| 7,220,600 B2 * | | 5/2007 | Summerfelt et al. ............ 438/3 |

FOREIGN PATENT DOCUMENTS

| JP | A 2001-116943 | 4/2001 |
|---|---|---|
| JP | A 2004-031521 | 1/2004 |

OTHER PUBLICATIONS

Yeh et al. Ferroelectrics vol. 380, No. 1, (2009) pp. 97-101.*

* cited by examiner

*Primary Examiner* — Nadine Norton
*Assistant Examiner* — Maki Angadi
(74) *Attorney, Agent, or Firm* — Oliff & Berridge, PLC

(57) ABSTRACT

A manufacturing method of the present invention comprises the step of epitaxially growing a PZT layer on a first electrode layer, and the step of processing the PZT layer to a desired shape using an etching solution after the growing step. The etching solution contains at least one acid from among hydrochloric acid and nitric acid in a concentration $C_{HCl}+3.3C_{HNO_3}$ ranging from 1 wt % to 10 wt %, $C_{HCl}$ and $C_{HNO_3}$ denoting, respectively, a weight concentration of the hydrochloric acid and nitric acid relative to a weight of the etching solution; and at least one fluorine compound from among ammonium fluoride and hydrogen fluoride, such that a weight concentration of fluorine derived from ammonium fluoride and hydrogen fluoride ranges from 0.1 wt % to 1 wt % relative to the weight of the etching solution.

1 Claim, 17 Drawing Sheets

Fig.11

| | $C_{HCl}$ (wt%) | $C_{HNO_3}$ (wt%) | HF CONC. (F BASIS) (wt%) | NH$_4$F CONC. (F BASIS) (wt%) | CONC. VALUE A (wt%) | CONC. VALUE B (wt%) |
|---|---|---|---|---|---|---|
| EXAMPLE 1 | 2 | — | 0.05 | 0.1 | 2 | 0.15 |
| EXAMPLE 2 | 4 | — | — | 0.2 | 4 | 0.2 |
| EXAMPLE 3 | 5 | — | 0.1 | 0.5 | 5 | 0.6 |
| EXAMPLE 4 | 8 | — | 0.1 | 0.8 | 8 | 0.9 |
| EXAMPLE 5 | 5 | 1 | 0.1 | 0.8 | 8.3 | 0.9 |
| EXAMPLE 6 | 2 | 2 | 0.1 | 0.8 | 8.6 | 0.9 |
| EXAMPLE 7 | 3 | 2 | 0.5 | 0.1 | 9.6 | 0.6 |

Fig.12

| | $C_{HCl}$ (wt%) | $C_{HNO_3}$ (wt%) | HF CONC. (F BASIS) (wt%) | NH₄F CONC. (F BASIS) (wt%) | CONC. VALUE A (wt%) | CONC. VALUE B (wt%) |
|---|---|---|---|---|---|---|
| EXAMPLE 8 | 2 | — | 0.1 | 0.05 | 2 | 0.15 |
| EXAMPLE 9 | 4 | — | 0.2 | — | 4 | 0.2 |
| EXAMPLE 10 | 5 | — | 0.5 | 0.1 | 5 | 0.6 |
| EXAMPLE 11 | 8 | — | 0.8 | 0.1 | 8 | 0.9 |
| EXAMPLE 12 | 5 | 1 | 0.8 | 0.1 | 8.3 | 0.9 |
| EXAMPLE 13 | 2 | 2 | 0.8 | 0.1 | 8.6 | 0.9 |
| EXAMPLE 14 | 3 | 2 | 0.1 | 0.5 | 9.6 | 0.6 |
| EXAMPLE 15 | — | 2 | 0.1 | 0.5 | 6.6 | 0.6 |

Fig.13

| | $C_{HCl}$ (wt%) | $C_{HNO_3}$ (wt%) | HF CONC. (F BASIS) (wt%) | NH4F CONC. (F BASIS) (wt%) | CONC. VALUE A (wt%) | CONC. VALUE B (wt%) |
|---|---|---|---|---|---|---|
| COMPARATIVE EXAMPLE 1 | 0.5 | — | 0.1 | 0.5 | 0.5 | 0.6 |
| COMPARATIVE EXAMPLE 2 | 12 | — | 0.1 | 0.5 | 12 | 0.6 |
| COMPARATIVE EXAMPLE 3 | 5 | — | 0.05 | — | 5 | 0.05 |
| COMPARATIVE EXAMPLE 4 | 5 | — | — | 0.05 | 5 | 0.05 |
| COMPARATIVE EXAMPLE 5 | 2 | — | 1 | 1 | 2 | 2 |
| COMPARATIVE EXAMPLE 6 | 5 | 5 | 0.1 | 0.8 | 21.5 | 0.9 |
| COMPARATIVE EXAMPLE 7 | 5 | 3 | 0.1 | 0.8 | 14.9 | 0.9 |
| COMPARATIVE EXAMPLE 8 | 5 | 5 | 0.8 | 0.1 | 21.5 | 0.9 |
| COMPARATIVE EXAMPLE 9 | 5 | 3 | 0.8 | 0.1 | 14.9 | 0.9 |

Fig.14

| | HCl | HNO₃ | HF | NH₄F | CONC. VALUE A (wt%)/ CONC. VALUE B (wt%) | ETCHING RATE (nm/sec) | | HCl | HNO₃ | HF | NH₄F | CONC. VALUE A (wt%)/ CONC. VALUE B (wt%) | ETCHING RATE (nm/sec) |
|---|---|---|---|---|---|---|---|---|---|---|---|---|---|
| EXAMPLE 1 | ○ | | ○ | ○ | 2 / 0.15 | 5 | EXAMPLE 9 | ○ | | ○ | | 4 / 0.2 | 8 |
| EXAMPLE 2 | ○ | ○ | | ○ | 4 / 0.2 | 7 | EXAMPLE 10 | ○ | | ○ | ○ | 5 / 0.6 | 13 |
| EXAMPLE 3 | ○ | | ○ | ○ | 5 / 0.6 | 13 | EXAMPLE 11 | ○ | | ○ | ○ | 8 / 0.9 | 30 |
| EXAMPLE 4 | ○ | ○ | ○ | ○ | 8 / 0.9 | 30 | EXAMPLE 12 | ○ | ○ | ○ | ○ | 8.3 / 0.9 | 35 |
| EXAMPLE 5 | ○ | ○ | ○ | ○ | 8.3 / 0.9 | 30 | EXAMPLE 13 | ○ | ○ | ○ | ○ | 8.6 / 0.9 | 40 |
| EXAMPLE 6 | ○ | ○ | ○ | ○ | 8.6 / 0.9 | 40 | EXAMPLE 14 | ○ | ○ | ○ | ○ | 9.6 / 0.6 | 45 |
| EXAMPLE 7 | ○ | | ○ | ○ | 9.6 / 0.6 | 45 | EXAMPLE 15 | | ○ | ○ | ○ | 6 / 0.6 | 25 |
| EXAMPLE 8 | ○ | ○ | ○ | ○ | 2 / 0.15 | 6 | COMPARATIVE EXAMPLE 1 | ○ | | ○ | ○ | 0.5 / 0.6 | 2 |

| | HCl | HNO₃ | HF | NH₄F | CONC. VALUE A (wt%)/ CONC. VALUE B (wt%) | ETCHING RATE (nm/sec) |
|---|---|---|---|---|---|---|
| COMPARATIVE EXAMPLE 2 | ○ | | ○ | ○ | 12 / 0.6 | 70 |
| COMPARATIVE EXAMPLE 3 | ○ | | ○ | | 5 / 0.05 | 3 |
| COMPARATIVE EXAMPLE 4 | ○ | | | ○ | 5 / 0.05 | 2 |
| COMPARATIVE EXAMPLE 5 | ○ | | ○ | ○ | 2 / 2 | 100以上 |
| COMPARATIVE EXAMPLE 6 | ○ | ○ | ○ | ○ | 21.5 / 0.9 | 100以上 |
| COMPARATIVE EXAMPLE 7 | ○ | ○ | ○ | ○ | 14.9 / 0.9 | 90 |
| COMPARATIVE EXAMPLE 8 | ○ | ○ | ○ | ○ | 21.5 / 0.9 | 100以上 |
| COMPARATIVE EXAMPLE 9 | ○ | ○ | ○ | ○ | 14.9 / 0.9 | 88.6 |

METHOD FOR MANUFACTURING PIEZOELECTRIC ELEMENT

BACKGROUND OF THE INVENTION

1. Field of the Invention

The present invention relates to methods for manufacturing piezoelectric elements.

2. Related Background Art

Known piezoelectric elements include piezoelectric elements having a structure wherein an epitaxially grown lead zirconate titanate (PZT) layer is sandwiched between a pair of metallic layers. In the manufacture of such a piezoelectric element, the metallic layer and the PZT layer are sequentially epitaxially grown on a substrate, and then the PZT layer is processed. Ordinary methods for processing the PZT layer include wet etching using an etching solution (for instance, Japanese Patent Application Laid-open No. 2004-31521, Japanese Patent Application Laid-open No. 2001-116943, and U.S. Pat. No. 4,759,823).

Japanese Patent Application Laid-open No. 2004-31521 discloses a method for processing PZT layers using an etching solution that contains any acid from among hydrogen fluoride (HF), buffered hydrofluoric acid (BHF), diluted hydrofluoric acid (DHF), sulfuric acid ($H_2SO_4$), hydrochloric acid (HCl) or nitric acid ($HNO_3$). Japanese Patent Application Laid-open No. 2001-116943 discloses a method for processing amorphous PZT layers using a 12% aqueous solution of HCl as an etching solution. U.S. Pat. No. 4,759,823 discloses a method for processing PZT layers formed by a sol-gel method, by employing an etching solution that contains HCl, HF and ammonium fluoride ($NH_4F$) in weight concentrations of 0.35 wt % to 35 wt %, 0.01 wt % to 2.2 wt %, and 0.02 wt % to 9.3 wt %, respectively, relative to the weight of the etching solution.

When using an etching solution such as the above-described ones, containing an acid such as hydrochloric acid, for processing epitaxially grown PZT layers, the etching rate of the PZT layer by the etching solution was either very high or very low, and hence it was difficult to process PZT layers at an appropriate etching rate. Pattern shapes are difficult to control when the etching rate is very high. The pattern edge shape becomes unstable as a result. On the other hand, a very low etching rate entails lower productivity.

SUMMARY OF THE INVENTION

In the light of the above, it is an object of the present invention to provide a method for manufacturing a piezoelectric element that allows processing an epitaxially grown PZT layer at an appropriate etching rate.

To attain the above goal, a first method for manufacturing a piezoelectric element comprises the step of epitaxially growing a lead zirconate titanate layer on a lower electrode layer; and the step of processing the lead zirconate titanate layer to a desired shape using an etching solution, after the growing step; wherein the etching solution contains at least one acid from among hydrochloric acid and nitric acid in a concentration $C_{HCl}+3.3C_{HNO3}$ ranging from 1 wt % to 10 wt %, $C_{HCl}$ and $C_{HNO3}$ denoting, respectively, a weight concentration of hydrochloric acid and nitric acid relative to a weight of the etching solution; and at least one fluorine compound from among ammonium fluoride and hydrogen fluoride, such that a weight concentration of fluorine derived from ammonium fluoride and hydrogen fluoride ranges from 0.1 wt % to 1 wt % relative to the weight of the etching solution.

In the processing step, the first method for manufacturing a piezoelectric element uses an etching solution that contains a fluorine compound, and an acid such as hydrochloric acid or the like at concentrations within the above specific ranges. The fluorine compound functions as an etchant, by dissolving oxides, while the acid such as hydrochloric acid or the like has the function of ionizing metal after etching. The epitaxially grown piezoelectric layer can be processed at an appropriate etching rate in the processing step by using an etching solution having a fluorine compound and an acid such as hydrochloric acid or the like, which have different functions, in the above-described specific concentration ranges.

A second method for manufacturing a piezoelectric element is the first method for manufacturing a piezoelectric element further comprising the step of forming a $SrRuO_3$ layer (SRO layer) having an orientation plane other than a (100) plane, on the lead zirconate titanate layer, after the growing step; the step of forming an upper electrode layer on the SRO layer, after the step of forming the SRO layer; and the step of fixing a substrate on the upper electrode layer; wherein in the processing step, the lead zirconate titanate layer is preferably etched in a direction from the lower electrode layer towards the substrate. An SRO layer having an orientation plane other than a (100) plane hardly reacts with the etching solution used in the laminate processing step. In the processing step, therefore, etching of the lead zirconate titanate layer progresses in the direction from the lower electrode layer towards the substrate. As a result, it becomes possible to prevent the etching solution from etching a second electrode layer that is positioned below the SRO layer having an orientation plane other than a (100) plane, as the case may require.

The first method for manufacturing a piezoelectric element provides a method for manufacturing a piezoelectric element that allows processing an epitaxially grown PZT layer at an appropriate etching rate.

BRIEF DESCRIPTION OF THE DRAWINGS

FIG. 11 is diagram for explaining the effect of the manufacturing method according to the embodiment;

FIG. 12 is diagram for explaining the effect of the manufacturing method according to the embodiment;

FIG. 13 is diagram for explaining the effect of the manufacturing method according to the embodiment;

FIG. 14 is diagram for explaining the effect of the manufacturing method according to the embodiment;

DESCRIPTION OF THE PREFERRED EMBODIMENTS

Figure 1:
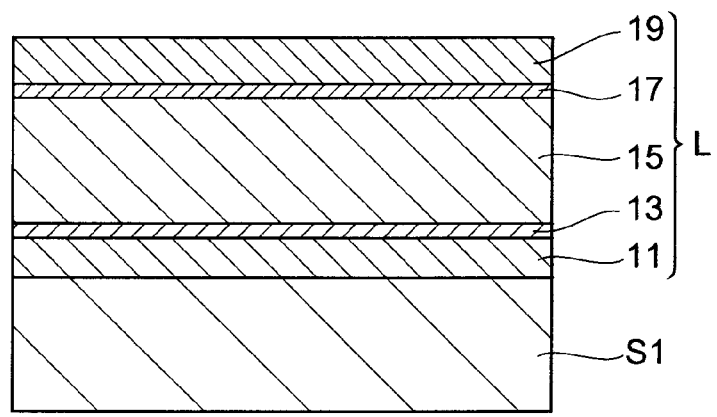
FIG. 1 is a diagram illustrating schematically one step of a manufacturing method according to a first embodiment of the present invention.

Preferred embodiments of the method for manufacturing a piezoelectric element according to the present invention are explained in detail below with reference to accompanying drawings. The piezoelectric element manufactured in accordance with the manufacturing method of the present embodiment is, for instance, a thin film piezoelectric element actuator. The piezoelectric element, however, is not limited to a thin film piezoelectric element actuator, and may be a capacitor, a sensor or the like. In the explanation of the drawings, identical elements are denoted with identical reference numerals, and recurrent explanations thereof are omitted.

First Embodiment

Figure 3A:
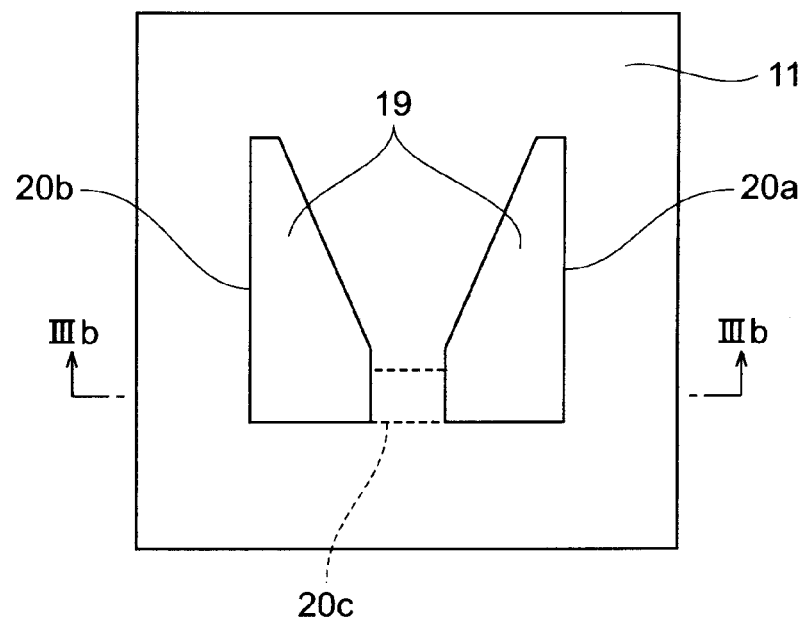
FIGS. 3A and 3B are diagrams illustrating schematically one step of the manufacturing method according to the first embodiment of the present invention.
Figure 3B:
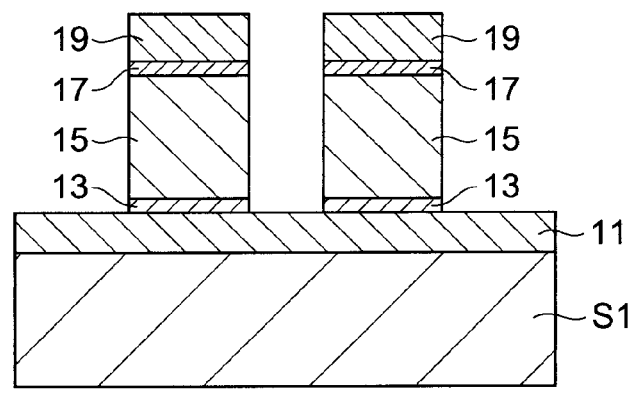
Figure 4A:
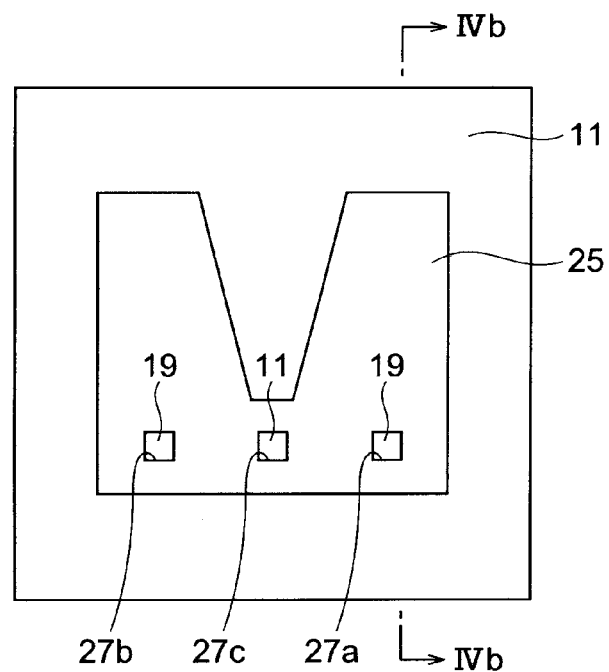
FIGS. 4A and 4B are diagrams illustrating schematically one step of the manufacturing method according to the first embodiment of the present invention.
Figure 4B:
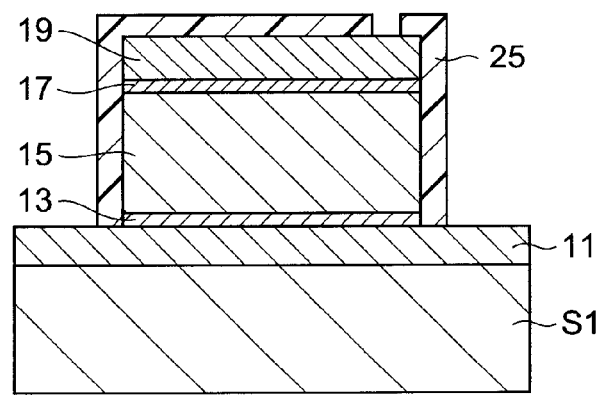
Figure 5A:
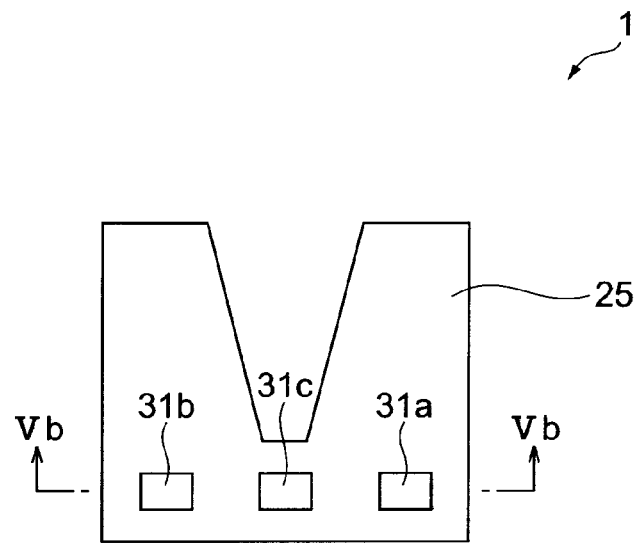
FIGS. 5A and 5B are diagrams illustrating schematically one step of the manufacturing method according to the first embodiment of the present invention.
Figure 5B:
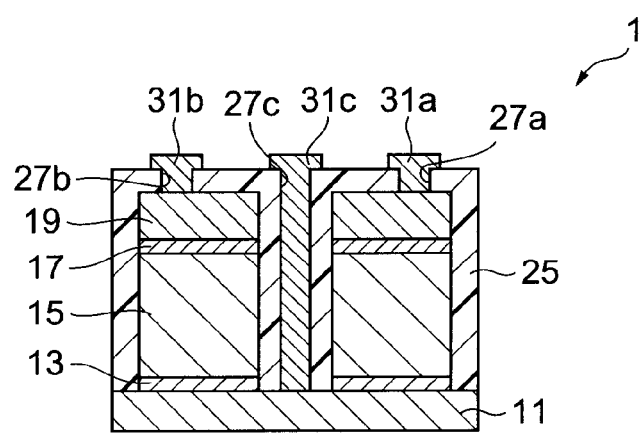

A method for manufacturing a thin-film piezoelectric actuator 1 is explained next with reference to FIGS. 1 to 5, wherein FIG. 1, FIG. 2, FIG. 3A, FIG. 4A and FIG. 5A are diagrams illustrating schematically various steps in the method for manufacturing the thin-film piezoelectric actuator 1. In the figures, FIG. 3B is a schematic diagram illustrating the cross-sectional build-up of FIG. 3A along direction IIIb-IIIb; FIG. 4B is a schematic diagram illustrating the cross-sectional build-up of FIG. 4A along IVb-IVb; and FIG. 5B is a schematic diagram illustrating the cross-sectional build-up of FIG. 5A along direction Vb-Vb.

(Laminate formation step) In this step there is formed, on a substrate S1, a laminate L comprising a first electrode layer (lower electrode layer) 11, a seed (underlaying) layer 13, a layer comprising lead zirconate titanate (PZT layer) 15, an inorganic (seed) layer 17 and a second electrode layer 19, as illustrated in FIG. 1. The substrate S1 is prepared first. The substrate S1 is not particularly limited, so long as the laminate L can be formed thereon, and may be selected from among, for instance, Si and MgO substrates. The thickness of the first substrate S1 is not particularly limited, and may range, for instance, from about 100 to about 3000 μm.

Next, the first electrode layer 11, the seed layer 13, the PZT layer 15, the inorganic layer 17 and the second electrode layer 19 are sequentially formed, by epitaxial growth or the like, on the substrate S1. Firstly, the first electrode layer 11 is epitaxially grown on the first substrate S1. On the first electrode layer 11 there is epitaxially grown next the seed layer 13 for improving the orientation of the PZT layer 15. The surface of the seed layer 13 itself has preferably a (001) plane orientation. The PZT layer 15 is epitaxially grown next. On the PZT layer 15 there is formed next the inorganic layer 17, for enhancing the adherence of the second electrode layer 19, and then the second electrode layer 19 is formed on the inorganic layer 17.

The surface of the PZT layer 15 formed on the seed layer 13 having a (001) plane orientation has preferably a (001) plane orientation. That is, the PZT layer 15 is grown in the <001> direction, and hence a ferroelectric layer can be obtained in which there occurs spontaneous polarization that causes matter in the layer to form electric dipoles, even in the absence of an external electric field. A layer deposition method such as sputtering, CVD or the like can be used as the epitaxial growth method for forming the layers 11, 13 and 15. Depending on the conditions, layer deposition can also be carried out without using the seed layer 13.

The material of the first electrode layer 11 is preferably a metal that virtually does not react with a below-described etching solution Q, and may be a platinum-group metal such as Pt, or Au or the like. The thickness of the first electrode layer 11 is not particularly limited, and may range, for instance, from about 0.1 to about 1 μm.

The seed layer 13 is not particularly limited, but has preferably a perovskite structure. The seed layer 13 used may optionally function as a piezoelectric material, and may be, for instance, lanthanum-doped lead titanate (PLT), or lead titanate ($PbTiO_3$). The thickness of the seed layer 13 is not particularly limited, and may range, for instance, from about to 5 to about 100 nm. The thickness of the PZT layer 15 is not particularly limited, and may range, for instance, from about 0.5 to about 10 μm. The PZT layer 15 has preferably a (111) plane orientation or a (001) plane orientation.

Preferably, the inorganic layer 17 comprises the same material as the seed layer 13, although the material may be different. The thickness of the inorganic layer 17 is not particularly limited, and may range, for instance, from about 5 to about 100 nm. Preferably, the second electrode layer 19 comprises the same material as the first electrode layer 11, although the material may be different. The thickness of the second electrode layer 19 is not particularly limited, and may range, for instance, from about 0.1 to about 1 μm. As a result the above process there is completed the laminate L, comprising the first electrode layer 11, the seed layer 13, the PZT layer 15, the inorganic layer 17 and the second electrode layer 19, on the substrate S1.

In the present embodiment, the laminate L is formed through sequential epitaxial growth of the first electrode layers 11, 13 and 15 on the substrate S1, but the laminate L may further comprise other layers, and may be formed in accordance with other methods. The laminate L may be manufactured, for instance, in accordance with the following method. Two substrates S1, S2 are prepared first. Thereafter, the second electrode layer 19, the inorganic (seed) layer 17, the PZT layer 15, the seed (underlaying) layer 13 and the first electrode layer 11 are sequentially formed, through epitaxial growth or the like, on the substrate S2. Next, the first electrode layer 11 and the substrate S1 are stacked, facing each other, with a resin layer (adhesive layer) in between, followed by thermal curing under pressure to elicit bonding, after which the substrate S2 is removed. The above method yields a laminate L further comprising a resin layer between the substrate S1 and the first electrode layer 11.

Figure 2:
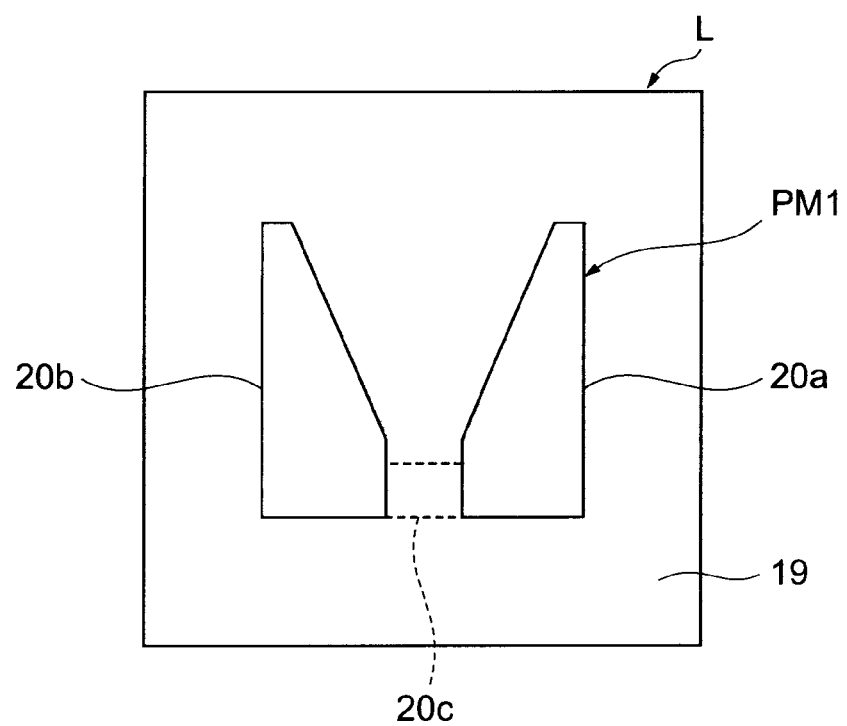
FIG. 2 is a diagram illustrating schematically one step of the manufacturing method according to the first embodiment of the present invention.

(Laminate processing step) The laminate L is then processed (patterned) to a desired shape, as illustrated in FIG. 2. Firstly, a resist mask PM1, having a first region 20a and a second region 20b opposing each other and flanking and third region 20c, is lithographically formed on the second electrode layer 19 of the laminate L. Thereafter, the second electrode layer 19 and the inorganic layer 17 are patterned by dry etching using the resist mask PM1 as a mask layer. The PZT layer 15 and the seed layer 13 are etched next, using an etching solution Q, until the first electrode layer 11 is exposed. The temperature of the etching solution Q ranges preferably from 20° C. to 40° C. The resist mask PM1 is removed next. The laminate L is processed thus in accordance with the above laminate processing step to allow forming the first region 20a and the second region 20b at positions flanking the third region 20c (see FIGS. 3A and 3B).

The etching solution Q contains at least one acid from among HCl and $HNO_3$, and at least one fluorine compound from among ammonium fluoride ($NH_4F$) and hydrogen fluoride (HF). The at least one acid from among HCl and $HNO_3$ satisfies a condition (hereafter, "condition A") to the effect that $C_{HCl}+3.3C_{HNO3}$ (hereafter, "concentration value A") ranges from 1 wt % to 10 wt %, wherein $C_{HCl}$ and $C_{HNO3}$ denote, respectively, the weight concentration of HCl and $HNO_3$ relative to the weight of the etching solution Q. The fluorine compound satisfies a condition (hereafter, "condition B") to the effect that the weight concentration of fluorine derived from $NH_4F$ and HF (hereafter, "concentration value B") relative to the weight of the etching solution Q ranges from 0.1 wt % to 1 wt %.

(Other steps) Next, a resin layer 25 comprising a photosensitive material is formed in such a way so as to cover the surfaces of the first electrode layer 11, the first region 20a, the second region 20b and the third region 20c. The laminate is then irradiated with i beams, via a photomask, to selectively cure the resin layer 25 on the surface of the first region 20a, the second region 20b and the third region 20c, but leaving uncured the portions that constitute contact holes 27a to 27c. The uncured portions of the resin layer 25, such as the portions that constitute the contact holes 27a to 27c, are removed next. The remaining portions of the resin layer 25 are baked to be cured to a sufficient strength (see FIGS. 4A and 4B).

A resist layer (not shown) having openings at positions corresponding to the contact holes 27a to 27c is formed next. Respective electrodes 31a to 31c are then vapor-deposited on the first electrode layer 11 and the second electrode layer 19 that has been exposed through formation of the contact holes 27a to 27c using the resist layer as a mask layer. The first electrode layer 11 is then patterned to an element shape by dry etching, after which the substrate S1 is removed (see FIGS. 5A and 5B). When a Si single-crystal substrate is used as the first substrate S1, as in the present embodiment, the first substrate S1 can be removed by wet etching using hydrofluoric-nitric acid, or by dry etching such as reactive ion etching (RIE) or the like. The substrate may be removed by polishing using a grinding wheel (vertical) or using colloidal silica (CMP), as a pre-treatment roughing, or through polishing using a diamond slurry employing a soft-metal platen (tin platen or the like). This completes the thin-film piezoelectric actuator 1.

As described above, the method for manufacturing the thin-film piezoelectric actuator 1 according to the present embodiment uses an etching solution Q, containing at least one acid from among HCl and $HNO_3$, and at least one fluorine compound from among ammonium fluoride and hydrogen fluoride, in the processing step of the laminate L comprising the PZT layer 15. In the etching solution Q, the concentration value A of the at least one acid from among HCl and $HNO_3$ satisfies condition A, while the concentration value B of the fluorine compound satisfies condition B. The fluorine compound has an etching function, while the acid such as HCl or $HNO_3$ has the function of ionizing a metal after etching. The functions of the fluorine compound and the acid such as HCl or $HNO_3$ are different, and hence the proportions of the acid and the fluorine compound must be appropriate in order for the PZT layer 15 to be processed at an appropriate etching rate. In the laminate processing step according to the present embodiment, the etching solution Q contains an acid such as HCl and a fluorine compound, to a concentration value A and a concentration value B that satisfy condition A and condition B, respectively. Hence, the epitaxially grown PZT layer 15 can be processed at 5 to 50 nm/sec (hereafter, "target rate"). This allows, as a result, controlling the pattern shape and, reproducing pattern edges sharply, while averting losses in productivity.

Figure 6:
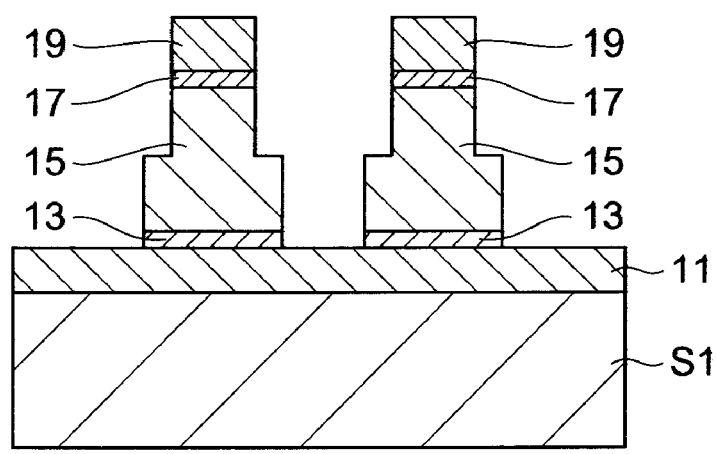
FIG. 6 is a diagram for explaining the effect of the manufacturing method according to the first embodiment of the present invention.
Figure 7:
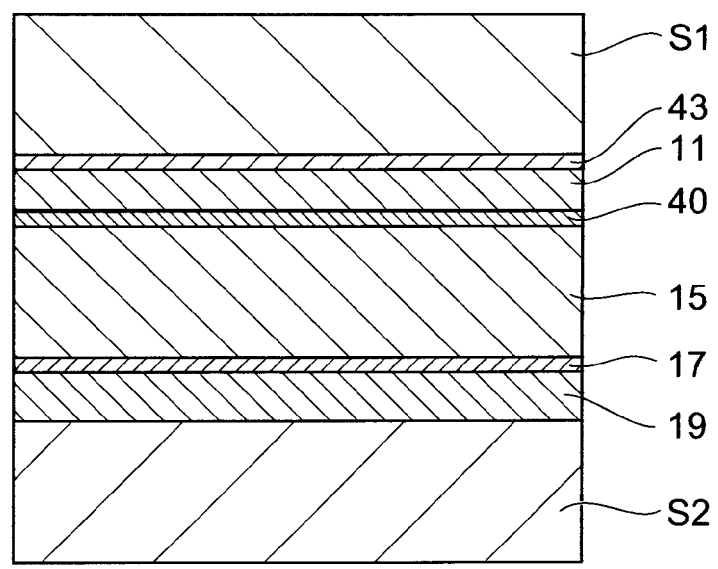
FIG. 7 is a diagram illustrating schematically one step of a manufacturing method according to a second embodiment of the present invention.

FIG. 6 is a schematic diagram for explaining the effect of the manufacturing method according to the present embodiment, corresponding to FIG. 3B, when using dry etching for comparison. When the laminate is processed by dry etching, the PZT layer 15 is ordinarily patterned to a stepped shape, as illustrated in FIG. 7. The reason for this is that, in dry etching, re-deposition occurs on the side faces of the etched PZT layer 15, as a result of which the electric characteristics of the element are impaired. It becomes therefore necessary to suppress re-deposition onto the side faces of the PZT layer 15. The above re-deposition problem is suppressed by forming the side faces of the PZT layer 15 to a stepped shape, although the resulting stepped shape reduces the volume of the PZT layer 15. In the laminate processing step according to the present embodiment, however, re-deposition on the side faces of the PZT layer 15 is sufficiently low, and hence the side faces need not be formed to a stepped shape. This allows securing the volume of the PZT layer 15 while streamlining the overall process, and makes thus for a less expensive element having higher performance and greater reliability.

Second Embodiment

An explanation follows next on a method for manufacturing a thin-film piezoelectric actuator 2 according to a second embodiment of the present invention, with reference to FIGS. 7 to 10. Among them, FIG. 7, FIG. 8, FIG. 9A and FIG. 10 are diagrams illustrating schematically the various steps of a method for manufacturing the thin-film piezoelectric actuator 2 according to the second embodiment, wherein FIG. 9B is a schematic diagram illustrating the cross-sectional build-up of FIG. 9A along IXb-IXb. The method for manufacturing the thin-film piezoelectric actuator 2 according to the second embodiment differs from the method for manufacturing a piezoelectric element according to the first embodiment in that now there are used two substrates S1 and S2, such that a laminate L is formed, on the substrate S2, through stacking in a reverse stacking direction as that of the first embodiment, as illustrated in FIG. 7; in that an adhesive layer 43 is provided in the laminate L; and in that an SRO layer 40, having an orientation plan other than a (100) plane, is used instead of the underlaying layer 13. These differences are explained in detail below.

(Laminate formation step) Firstly, a second electrode layer (lower electrode layer) 19, an inorganic (seed) layer 17 and a PZT layer 15 are sequentially layered, by epitaxial growth, on a substrate S2, as illustrated in FIG. 7. The substrate S2 is not particularly limited so long as the layers 19, 17 and 15 can be formed thereon, and may be selected, for instance, from among Si and MgO substrates. The thickness of the substrate S2 is not particularly limited, and may range, for instance, from about 100 to about 3000 μm. An SRO layer 40 and a first electrode layer (upper electrode layer) 11 are sequentially formed on the PZT layer 15. The layers 40, 11 can be formed by, for instance, sputtering or the like. The SRO layer 40 has preferably a (111) plane orientation or a (001) plane orientation. The thickness of the SRO layer 40 is not particularly limited, and may range, for instance, from about to 5 to about 50 nm. The first electrode layer 11 of the present embodiment is not particularly limited so long as it is a conductive material, and may be a material that is not etched by the etching solution Q, such as Pt, or a material that is etched by the etching solution Q, such as Cu, Ni, Al or the like.

Next, the substrate S1 is fixed to the first electrode layer 11 by way of the adhesive layer 43. More specifically, an adhesive layer 43 is formed on both the first electrode layer 11 and on the substrate 51 by coating, for instance by spin coating. Thereafter, the first electrode layer 11 and the substrate S1 are stacked facing each other, with the adhesive layers 43 interposed in between, and the whole is bonded through thermal curing under pressure. Bonding is preferably carried out by UV irradiation when the adhesive layer 43 is, for instance, a UV-curable epoxy resin. The above bonding may be carried out by forming the adhesive layer 43 on just one from among the first electrode layer 11 and the substrate S1. A thermally- and UV-curable adhesive is preferably used when registration is required in the above process.

The substrate S2 is removed thereafter. When a Si single-crystal substrate is used as the substrate S2, as in the present embodiment, the substrate S2 can be removed by wet etching using hydrofluoric-nitric acid, or by dry etching such as reactive ion etching (RIE) or the like. The substrate may be removed by polishing using a grinding wheel (vertical) or using colloidal silica (CMP), as a pre-treatment roughing, or through polishing using a diamond slurry employing a soft-metal platen (tin platen or the like).

The adhesive layer 43 is not particularly limited so long as the substrate S1 can be fixed to the first electrode layer 11 even if the adhesive layer 43 is not the above-described UV-curable epoxy resin. For instance, the adhesive layer 43 may be a resin adhesive such as an epoxy resin, an acrylic resin, a silicone resin, a polyimide resin, a fluororesin, a polyimide silicone resin, a benzocyclobutene (BCB) resin or the like, or a solder such as a Sn/Ag solder.

Figure 8:
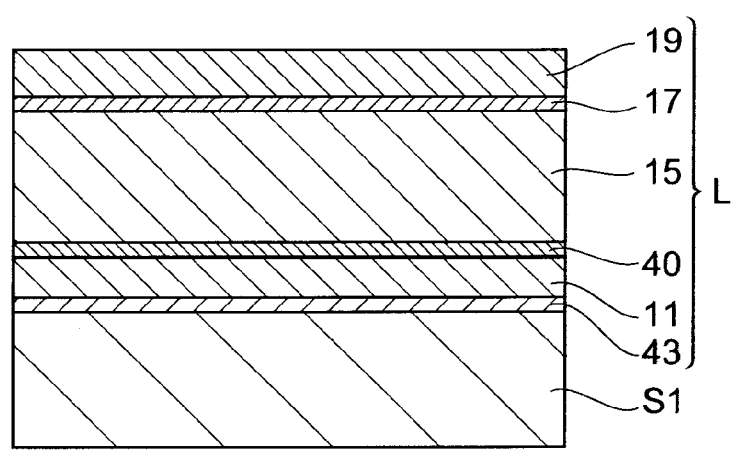
FIG. 8 is a diagram illustrating schematically one step of the manufacturing method according to the second embodiment of the present invention.
Figure 9A:
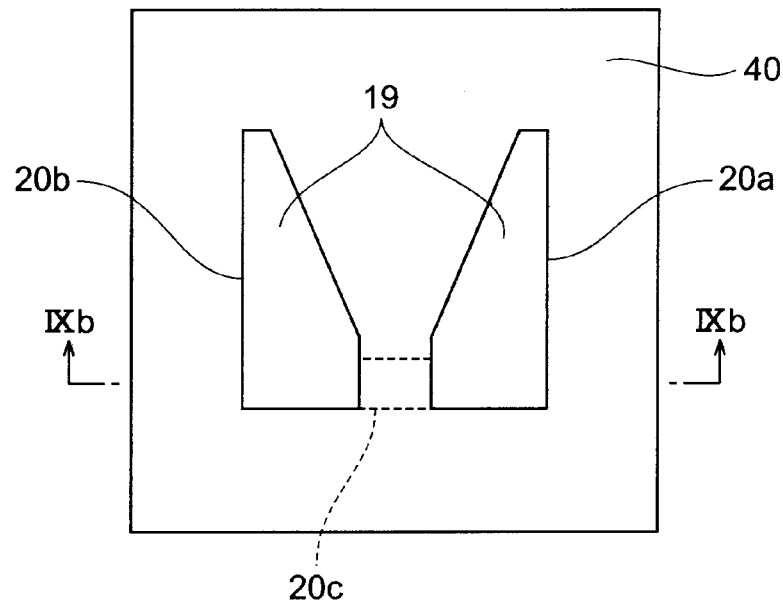
FIGS. 9A and 9B are diagrams illustrating schematically one step of the manufacturing method according to the second embodiment of the present invention.
Figure 9B:
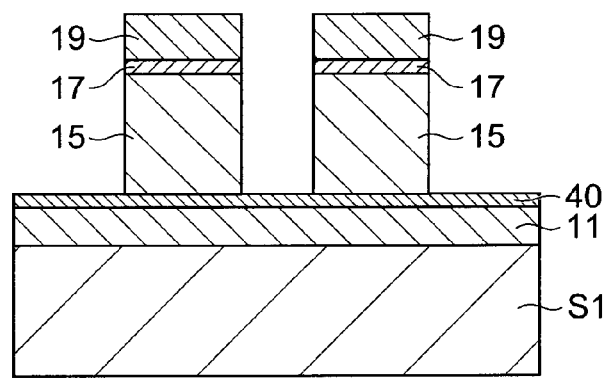

As a result of the above process there is formed a laminate L comprising the substrate S1 and, formed thereon, the adhesive layer 43, the first electrode layer 11, the SRO layer 40, the PZT layer 15, the inorganic layer 17 and the second electrode layer 19, as illustrated in FIG. 8.

(Laminate processing step) In this step, the laminate L is etched by dry etching and using the etching solution Q, employing a resist mask PM1 as a mask layer. The resist mask PM1 is removed thereafter. The results obtained by processing the laminate L using the etching solution Q are illustrated in the schematic diagrams of FIGS. 9A and 9B. Unlike a SiO$_2$ layer or the like, the SRO layer 40 does not react readily with the etching solution Q, and functions hence as an etching stop layer. As a result, etching proceeds until the SRO layer 40 is exposed, at portions outside the first region 20a and the second region 20b. Etching essentially stops when the SRO layer 40 becomes exposed. At the end of the above steps, therefore, the SRO layer 40 is exposed at portions outside the first region 20a and the second region 20b.

Figure 10:
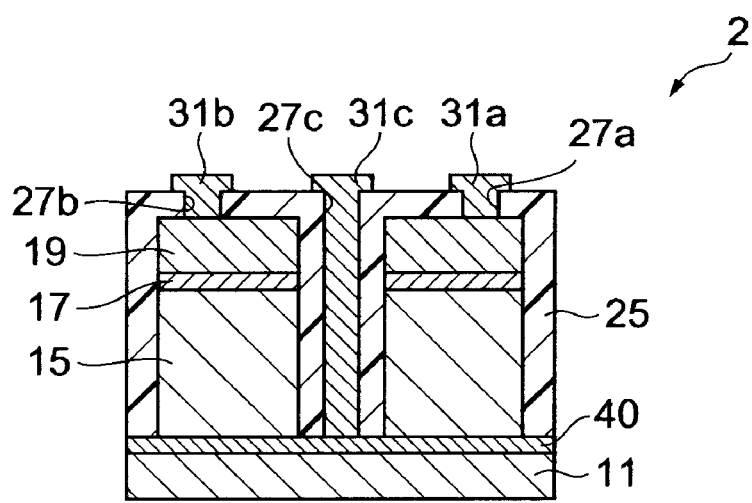
FIG. 10 is a diagram illustrating schematically one step of the manufacturing method according to the second embodiment of the present invention.

Subsequent processing, identical to that of the manufacturing method of the first embodiment, yields the thin-film piezoelectric actuator 2 illustrated in FIG. 10.

In the piezoelectric element manufacturing method according to the second embodiment, the second electrode layer 19, the inorganic (seed) layer 17 and the PZT layer 15 are sequentially layered, by epitaxial growth, on the substrate S2. Next, the SRO layer 40 and the first electrode layer 11 are sequentially formed, by sputtering or the like, on the PZT layer 15. Thereafter, the substrate S1 is fixed to the first electrode layer 11 by way of the adhesive layer 43, and the substrate S2 is removed. In the processing step, the PZT layer 15 is then etched, using the etching solution Q, in the direction from the second electrode layer (lower electrode layer) 19 towards the substrate S1. By virtue of the above-described steps comprised in the method for manufacturing a piezoelectric element according to the second embodiment, the second embodiment affords the below-described effects, in addition to the effects elicited by the method for manufacturing a piezoelectric element according to the first embodiment.

Specifically, the SRO layer 40, which has an orientation plane other than a (100) plane, hardly reacts with the etching solution Q during the processing step. In particular, an SRO layer 40 having a (111) plane orientation or a (001) plane orientation hardly reacts with the etching solution Q. As a result, the first electrode layer 11, disposed below the SRO layer 40 as the case may require, is prevented from being etched by the etching solution Q, even if the material of the first electrode layer 11 is Cu, Ni, Al or the like, which are etched by the etching solution Q. Moreover, it is no longer necessary to use costly Pt or the like, which is not etched by the etching solution Q, as the material of the first electrode layer 11. A comparatively inexpensive metal such as Cu, Ni, Al or the like can be used instead, whereby the cost of the element can be reduced.

Example 1

The relationship between the etching rate of the PZT layer and the composition of the etching solution in the present invention is explained next based on Examples 1 to 15 and Comparative examples 1 to 9. The present invention, however, is not limited to the examples below.

(Common conditions) Firstly, a 2 μm PZT layer having a (001) plane orientation was epitaxially grown, by sputtering, on a silicon substrate.

In Examples 1 to 15 and Comparative examples 1 to 9 below, the PZT layer formed on the silicon substrate was wet-etched using etching solutions of different compositions. FIG. 11 to FIG. 13 are tables summarizing the etching solutions used in Examples 1 to 15 and Comparative examples 1 to 9. Except for the composition of the etching solution, other conditions were identical in Examples 1 to 15 and Comparative examples 1 to 9. The etching time $t_E$ ranged from about 1 to about 10 minutes, and the etching temperature $T_E$ was the same, namely 22° C. The concentration in terms of F denotes the weight concentration of fluorine relative to the weight of etching solution.

(Example 1) Etching was carried out using an etching solution in which $C_{HCl}$ was 2 wt % and the concentration of HF and NH$_4$F, in terms of F, was 0.05 wt % and 0.1 wt %, respectively. That is, the concentration value A was 2 wt % and the concentration value B was 0.15 wt %.

(Example 2) Etching was carried out using an etching solution in which $C_{HCl}$ was 4 wt % and the concentration of NH$_4$F, in terms of F, was 0.2 wt %. That is, the concentration value A was 4 wt % and the concentration value B was 0.2 wt %.

(Example 3) Etching was carried out using an etching solution in which $C_{HCl}$ was 5 wt % and the concentration of HF and NH$_4$F, in terms of F, was 0.1 wt % and 0.5 wt %, respectively. That is, the concentration value A was 5 wt % and the concentration value B was 0.6 wt %.

(Example 4) Etching was carried out using an etching solution in which $C_{HCl}$ was 8 wt % and the concentration of HF and NH$_4$F, in terms of F, was 0.1 wt % and 0.8 wt %, respectively. That is, the concentration value A was 8 wt % and the concentration value B was 0.9 wt %.

(Example 5) Etching was carried out using an etching solution in which $C_{HCl}$ and $C_{HNO_3}$ were 5 wt % and 1 wt %, respectively, and the concentration of HF and NH$_4$F, in terms of F, was 0.1 wt % and 0.8 wt %, respectively. That is, the concentration value A was 8.3 wt % and the concentration value B was 0.9 wt %.

(Example 6) Etching was carried out using an etching solution in which $C_{HCl}$ and $C_{HNO_3}$ were both 2 wt % and the concentration of HF and NH$_4$F, in terms of F, was 0.1 wt % and 0.8 wt %, respectively. That is, the concentration value A was 8.6 wt % and the concentration value B was 0.9 wt %.

(Example 7) Etching was carried out using an etching solution in which $C_{HCl}$ and $C_{HNO_3}$ were 3 wt % and 2 wt %, respectively, and the concentration of HF and NH$_4$F, in terms of F, was 0.5 wt % and 0.1 wt %, respectively. That is, the concentration value A was 9.6 wt % and the concentration value B was 0.6 wt %.

(Example 8) Etching was carried out using an etching solution in which $C_{HCl}$ was 2 wt % and the concentration of HF and NH$_4$F, in terms of F, was 0.1 wt % and 0.05 wt %, respectively. That is, the concentration value A was 2 wt % and the concentration value B was 0.15 wt %.

(Example 9) Etching was carried out using an etching solution in which $C_{HCl}$ was 4 wt % and the concentration of HF, in terms of F, was 0.2 wt %. That is, the concentration value A was 4 wt % and the concentration value B was 0.2 wt %.

(Example 10) Etching was carried out using an etching solution in which $C_{HCl}$ was 5 wt % and the concentration of HF and NH$_4$F, in terms of F, was 0.5 wt % and 0.1 wt %, respectively. That is, the concentration value A was 5 wt % and the concentration value B was 0.6 wt %.

(Example 11) Etching was carried out using an etching solution in which $C_{HCl}$ was 8 wt % and the concentration of HF and NH$_4$F, in terms of F, was 0.8 wt % and 0.1 wt %, respectively. That is, the concentration value A was 8 wt % and the concentration value B was 0.9 wt %.

(Example 12) Etching was carried out using an etching solution in which $C_{HCl}$ and $C_{HNO_3}$ were 5 wt % and 1 wt %, respectively, and the concentration of HF and NH$_4$F, in terms of F, was 0.8 wt % and 0.1 wt %, respectively. That is, the concentration value A was 8.3 wt % and the concentration value B was 0.9 wt %.

(Example 13) Etching was carried out using an etching solution in which $C_{HCl}$ and $C_{HNO_3}$ were both 2 wt % and the concentration of HF and NH$_4$F, in terms of F, was 0.8 wt % and 0.1 wt %, respectively. That is, the concentration value A was 8.6 wt % and the concentration value B was 0.9 wt %.

(Example 14) Etching was carried out using an etching solution in which $C_{HCl}$ and $C_{HNO_3}$ were 3 wt % and 2 wt %, respectively, and the concentration of HF and NH$_4$F, in terms of F, was 0.1 wt % and 0.5 wt %, respectively. That is, the concentration value A was 9.6 wt % and the concentration value B was 0.6 wt %.

(Example 15) Etching was carried out using an etching solution in which $C_{HNO_3}$ was 2 wt %, and the concentration of HF and NH$_4$F, in terms of F, was 0.1 wt % and 0.5 wt %, respectively. That is, the concentration value A was 6.6 wt % and the concentration value B was 0.6 wt %.

(Comparative example 1) Etching was carried out using an etching solution in which $C_{HCl}$ was 0.5 wt % and the concentration of HF and NH$_4$F, in terms of F, was 0.1 wt % and 0.5 wt %, respectively. That is, the concentration value A was 0.5 wt % and the concentration value B was 0.6 wt %.

(Comparative example 2) Etching was carried out using an etching solution in which $C_{HCl}$ was 12 wt % and the concentration of HF and NH$_4$F, in terms of F, was 0.1 wt % and 0.5 wt %, respectively. That is, the concentration value A was 12 wt % and the concentration value B was 0.6 wt %.

(Comparative example 3) Etching was carried out using an etching solution in which $C_{HCl}$ was 5 wt % and the concentration of HF, in terms of F, was 0.05 wt %. That is, the concentration value A was 5 wt % and the concentration value B was 0.05 wt %.

(Comparative example 4) Etching was carried out using an etching solution in which $C_{HCl}$ was 5 wt % and the concentration of NH$_4$F, in terms of F, was 0.05 wt %. That is, the concentration value A was 5 wt % and the concentration value B was 0.05 wt %.

(Comparative example 5) Etching was carried out using an etching solution in which $C_{HCl}$ was 2 wt % and the concentration of HF and NH$_4$F, in terms of F, were both 1 wt %. That is, the concentration value A was 2 wt % and the concentration value B was 2 wt %.

(Comparative example 6) Etching was carried out using an etching solution in which $C_{HCl}$ and $C_{HNO_3}$ were both 5 wt % and the concentration of HF and NH$_4$F, in terms of F, was 0.1 wt % and 0.8 wt %, respectively. That is, the concentration value A was 21.5 wt % and the concentration value B was 0.9 wt %.

(Comparative example 7) Etching was carried out using an etching solution in which $C_{HCl}$ and $C_{HNO_3}$ were 5 wt % and 3 wt %, respectively, and the concentration of HF and NH$_4$F, in terms of F, was 0.1 wt % and 0.8 wt %, respectively. That is, the concentration value A was 14.9 wt % and the concentration value B was 0.9 wt %.

(Comparative example 8) Etching was carried out using an etching solution in which $C_{HCl}$ and $C_{HNO_3}$ were both 5 wt % and the concentration of HF and NH$_4$F, in terms of F, was 0.8 wt % and 0.1 wt %, respectively. That is, the concentration value A was 21.5 wt % and the concentration value B was 0.9 wt %.

(Comparative example 9) Etching was carried out using an etching solution in which $C_{HCl}$ and $C_{HNO_3}$ were 5 wt % and 3 wt %, respectively, and the concentration of HF and NH$_4$F, in terms of F, was 0.8 wt % and 0.1 wt %, respectively. That is, the concentration value A was 14.9 wt % and the concentration value B was 0.9 wt %.

(Result evaluation) FIG. 14 is a table summarizing the etching rate of the PZT layer versus etching solution, for Examples 1 to 15 and Comparative examples 1 to 9. As illustrated in FIG. 14, the etching rate of the PZT layers ranged from 5 to 50 nm/sec (target rate) in Examples 1 to 15, which use etching solutions that satisfy both condition A and condition B. When at least one from among condition A and condition B was not satisfied, the etching rate of the PZT layer lay outside the above target rate range.

Examples 1 to 7, Examples 8 to 14

Examples 8 to 14 correspond respectively to Examples 1 to 7. Specifically, the concentration value A and the concentration value B in Examples 8 to 14 are the same as the concentration value A and concentration value B in Examples 1 to 7, but the HF and NH$_4$F concentrations in terms of F in Examples 8 to 14 are the reverse of the HF and NH$_4$F concentrations in terms of F in Examples 1 to 7. However, it was found that the etching rate did not vary much provided that the concentration values A and B were identical across etching solutions, even if the concentrations of HF and NH$_4$F in terms of F were the reverse of each other.

Examples 1 to 4, Examples 5 to 7, Example 15

It was found that the etching rate of the PZT layers was kept within the target rate range when the etching solution satisfied both condition A and condition B, even if the etching solution did not contain both HCl and HNO$_3$.

Comparative Examples 1 and 2

In the case where the used etching solution contained no HNO$_3$, the etching rate was no higher than the target rate when the concentration value A dropped below condition A, even if condition B was satisfied. Conversely, the etching rate was not lower than the target rate when the concentration value A exceeded condition A.

Comparative Examples 3 to 5

The results of Comparative examples 3 and 4 showed that when the etching solution contained no HNO$_3$, the etching rate was not higher than the target rate when the concentration value B dropped below condition B, even if condition A was satisfied. The etching rate remained substantially the same when the concentration value B was identical, even if the etching solution contained only one from among HF and NH$_4$F. The results from Comparative example 5 showed that when the etching solution contained no HNO$_3$, the etching rate was not lower than the target rate when the concentration value B exceeded condition B, even if condition A was satisfied.

Comparative Examples 6 to 9

When the etching solution used contained all of HCl, HNO$_3$, HF and NH$_4$F, and condition B was satisfied, the etching rate was not lower than the target rate when the concentration value A exceeded condition A.

Figure 15:
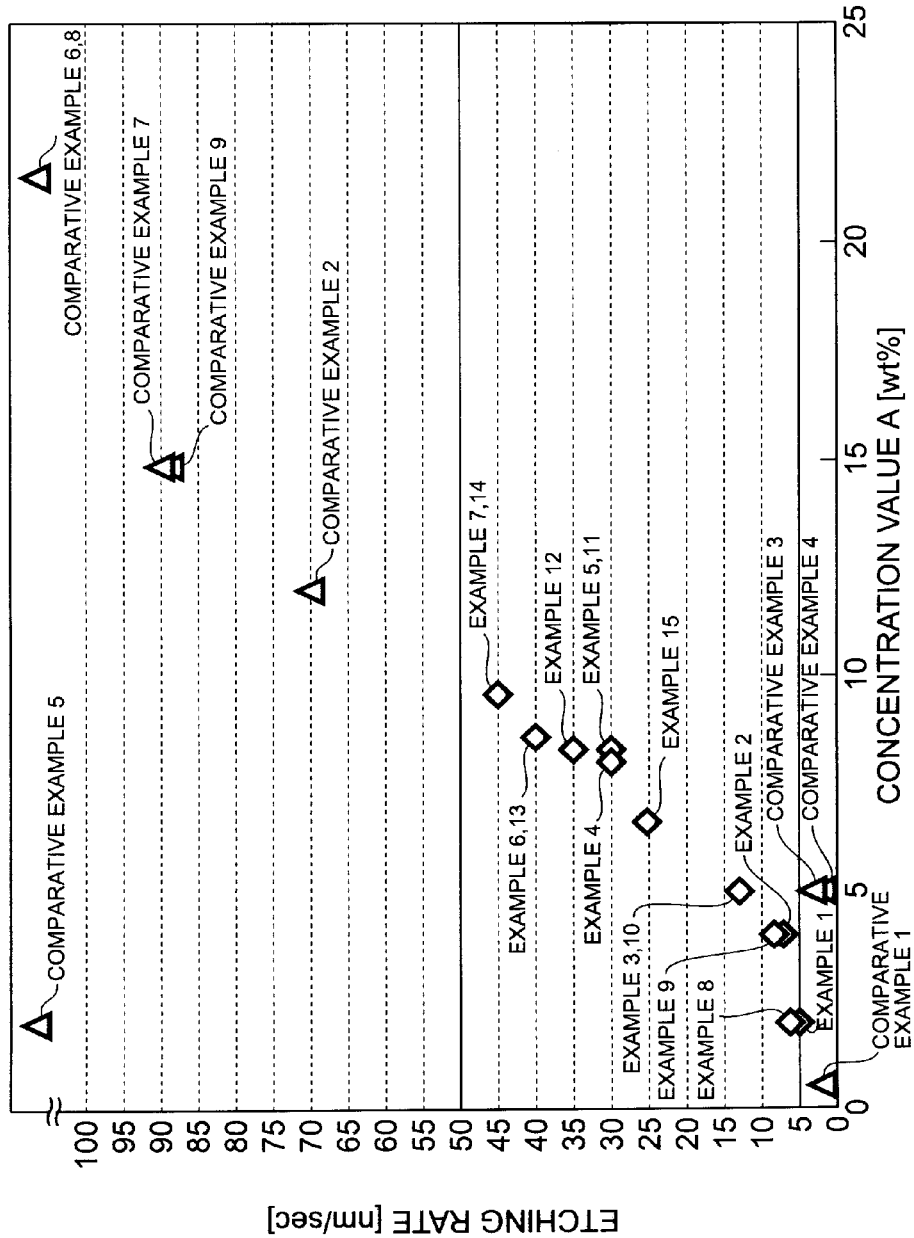
FIG. 15 is diagram for explaining the effect of the manufacturing method according to the embodiment.

FIG. 15 is graph illustrating the relationship between concentration value A and etching rate in Examples 1 to 15 and Comparative examples 1 to 9. In FIG. 15, the abscissa axis and the ordinate axis represent the concentration value A (wt %) and the etching rate (nm/sec), respectively. The lozenges (◇) denote the results of Examples 1 to 15, and the triangles (Δ) the results of Comparative examples 1 to 9. As illustrated in FIG. 15, the etching rate lies within the target rate range in Examples 1 to 15, and outside the target rate range in Comparative examples 1 to 9. Moreover, as can be seen, the etching rate increases when the concentration value A increases, in a directly proportional relationship to the latter.

The relationship between the edge shape of the patterned PZT layers and the etching rate of the PZT layers of the present invention will be explained below based on Example 16 and Comparative example 10. The present invention, however, is not limited to the examples below.

(Common conditions) Firstly, a 100 nm Pt layer, a 40 nm SRO layer having a (111) plane orientation and a 2 μm PZT layer having a (111) plane orientation were epitaxially grown in this order, by sputtering, on a silicon substrate. A resist layer having a plurality of rectangular openings was formed next.

The portions of the PZT layer not covered by the above-described resist layer were wet-etched, until the SRO layer was exposed, using etching solutions of Example 16 and Comparative example 10 below having dissimilar compositions. The resist layer was then removed. The etching temperature T$_E$ was the same, namely 22° C., in both Example 16 and Comparative example 10.

(Example 16) Wet etching was carried out using an etching solution having the same composition as the etching solution of Example 3 above.

(Comparative example 10) Wet etching was carried out using an etching solution having the same composition as the etching solution of Comparative example 7 above.

Figure 16A:
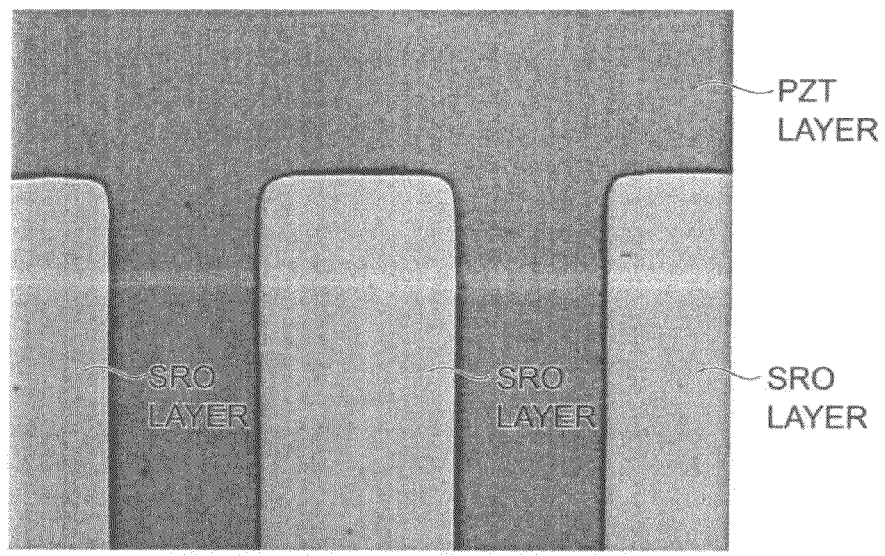
FIGS. 16A and 16B are diagrams for explaining the effect of the manufacturing method according to the embodiment.
Figure 16B:
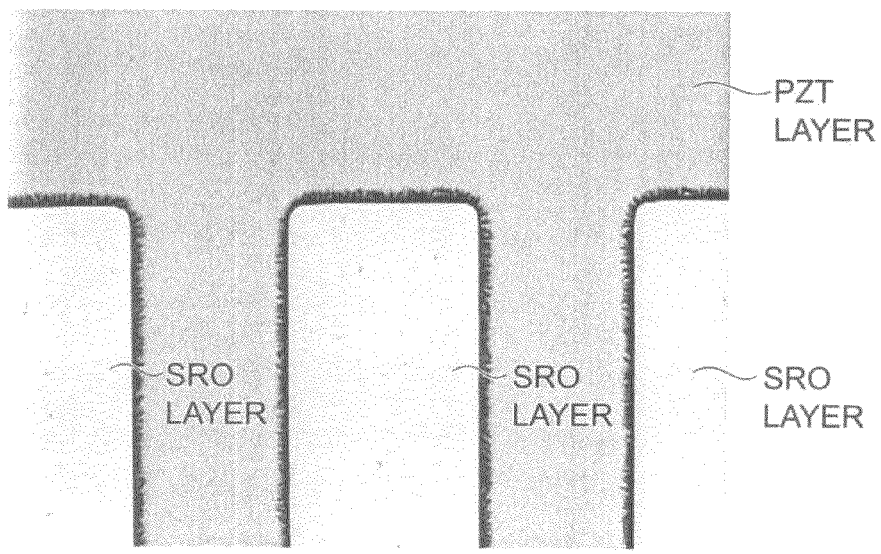

(Result evaluation) The etching rate of the PZT layer for the etching solution in Example 16 was the same as that of Example 3, namely 13 nm/sec, within the target rate range. The etching rate of the PZT layer by the etching solution in Comparative example 10 was the same as that of Comparative example 7, namely 90 nm/sec, outside the target rate range. The edges of the PZT layers patterned using the resist layer having a plurality of rectangular openings of Example 16 and Comparative example 10 are illustrated in FIGS. 16A and 16B. In Example 16, where the etching rate lay within the target rate range, the edge portion of the patterned PZT layer exhibited a sharp edge, having good rectilinearity, as illustrated in FIG. 16A.

In Comparative example 10, where the etching rate lay outside the target rate range (etching rate greater than the target rate), the edge portion of the patterned PZT layer, by contrast, was smeared and exhibited poor rectilinearity, as illustrated in FIG. 16B. The edges of the PZT layer were thus not sharp.

The relationship between the orientation plane of the SRO layer and resistance to the etching solution Q in the present invention is explained next based on Example 17, Example 18 and Comparative example 11. The present invention, however, is not limited to the examples below.

(Example 17) Firstly, a 100 nm Pt layer and a 40 nm SRO layer having a (111) plane orientation were epitaxially grown in this order, by sputtering, on a silicon substrate. A resist mask having a cross-sectional shape of a thin-film actuator was formed next on the SRO layer. Then, the SRO layer portions not covered by the above-described resist mask were etched for 20 seconds, using the resist mask as an etching mask, with an etching solution having the same composition as the etching solution in Example 3. The resist mask was removed thereafter.

(Example 18) Firstly, a 100 nm Pt layer and a 40 nm SRO layer having a (001) plane orientation were epitaxially grown in this order, by sputtering, on a silicon substrate. A resist mask having a cross-sectional shape of a thin-film actuator was formed next on the SRO layer. Then, the SRO layer portions not covered by the above-described resist mask were etched for 20 seconds, using the resist mask as an etching mask, with an etching solution having the same composition as the etching solution in Example 3. The resist mask was removed thereafter.

(Comparative example 11) Firstly, a 100 nm Pt layer and a 40 nm SRO layer having a (100) plane orientation were epitaxially grown in this order, by sputtering, on a silicon substrate. A resist mask having a cross-sectional shape of a thin-film actuator was formed next on the SRO layer. Then, the SRO layer portions not covered by the above-described resist mask were etched for 20 seconds, using the resist mask as an etching mask, with an etching solution having the same composition as the etching solution in Example 3. The resist mask was removed thereafter.

Figure 17A:
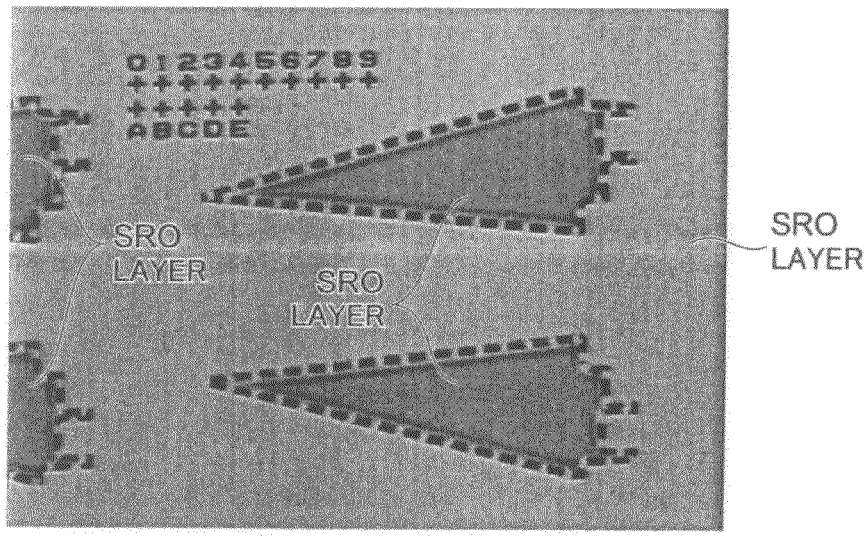
FIGS. 17A and 17B are diagrams for explaining the effect of the manufacturing method according to the embodiment.
Figure 17B:
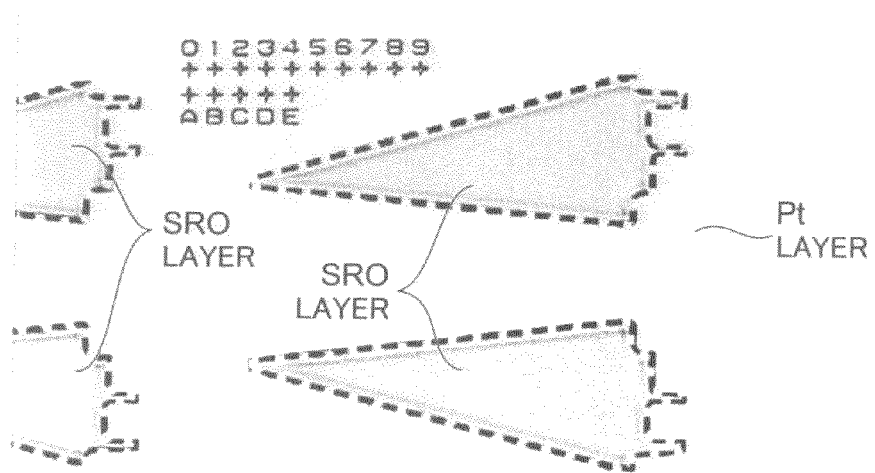

(Result evaluation) The edges of the SRO layers patterned using the resist layer having a plurality of rectangular openings in Example 17 and Comparative example 11 are illustrated in FIGS. 17A and 17B. In FIGS. 17A and 17B, the regions surrounded by a dotted line denote the regions covered by the above-described resist mask having a cross-sectional shape of a thin-film actuator. In Example 17, where the SRO layer was oriented in the (111) plane, there remained most of the SRO layer portions that were not covered by the resist mask, as illustrated in FIG. 17A. The residual amount of SRO layer was 95% relative to the amount prior to etching. In Example 18, where the SRO layer was oriented in the (001) plane, there remained most of the SRO layer portions, as was the case in FIG. 17A. By contrast, in Comparative example 10, where the SRO layer was oriented in the (100) plane, all the portions of the SRO layer not covered by the resist mask were etched away (residual amount of SRO layer was 0% relative to the amount prior to etching), and the Pt layer was exposed, as illustrated in FIG. 17B. This indicated that a SRO layer having a (100) plane orientation reacts more readily with the etching solution Q of the above-described embodiment as compared with a SRO layer having a (111) plane orientation or a (001) plane orientation.

What is claimed is:

1. A method for manufacturing a piezoelectric element comprising steps of: epitaxially growing a lead zirconate titanate layer on a lower electrode layer; forming a $SrRuO_3$ layer having an orientation plane other than a (100) plane, on the lead zirconate titanate layer, after growing step; forming an upper electrode layer on the $SrRuO_3$ layer, after the step of forming the $SrRuO_3$ layer; fixing a substrate on the upper electrode layer; and processing the lead zirconate titanate layer to a desired shape using an etching solution, after the growing step, wherein the etching solution contains: hydrochloride acid and nitric acid in a concentration $C_{HCl}+3.3_{HNO3}$ ranging from 1 wt % to 10 wt %, $C_{HCl}$ and $C_{HNO3}$ denoting, respectively, a weight concentration of the hydrochloride acid and the nitride acid relative to a weight of the etching solution; fluorine compound from among ammonium fluoride and hydrogen fluoride, such that a weight concentration of fluorine derived from the ammonium fluoride and/or the hydrogen fluoride ranges from 0.1 wt % to 1 wt % relative to the weight of the etching solution, and in the processing step, etching of the lead zirconate titanate layer progresses in a direction from the lower electrode layer towards the substrate.

* * * * *